(12) United States Patent
Nam et al.

(10) Patent No.: US 10,879,405 B2
(45) Date of Patent: Dec. 29, 2020

(54) SOLAR CELL

(71) Applicant: LG ELECTRONICS INC., Seoul (KR)

(72) Inventors: Jeongbeom Nam, Seoul (KR); Seunghwan Shim, Seoul (KR); Jisoo Ko, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/252,162

(22) Filed: Jan. 18, 2019

(65) Prior Publication Data
US 2019/0157474 A1   May 23, 2019

Related U.S. Application Data

(62) Division of application No. 15/220,172, filed on Jul. 26, 2016, now Pat. No. 10,217,877.

(30) Foreign Application Priority Data

Jul. 27, 2015   (KR) .......................... 10-2015-0105964
Jul. 15, 2016   (KR) .......................... 10-2016-0090036

(51) Int. Cl.
*H01L 31/00*        (2006.01)
*H01L 31/0224*      (2006.01)
(Continued)

(52) U.S. Cl.
CPC .. *H01L 31/022425* (2013.01); *H01L 31/0203* (2013.01); *H01L 31/02008* (2013.01);
(Continued)

(58) Field of Classification Search
CPC ................. H01L 31/022425; H01L 31/022441
See application file for complete search history.

(56) References Cited

U.S. PATENT DOCUMENTS

2004/0200520 A1   10/2004   Mulligan et al.
2009/0061627 A1   3/2009    Trassl et al.
(Continued)

FOREIGN PATENT DOCUMENTS

CN   102934236 A   2/2013
CN   103733352 A   4/2014
(Continued)

OTHER PUBLICATIONS

European Office Action for European Application No. 16181439.7, dated Jun. 18, 2020.

*Primary Examiner* — Angelo Trivisonno
(74) *Attorney, Agent, or Firm* — Birch, Stewart, Kolasch & Birch, LLP

(57) ABSTRACT

A solar cell includes a conductive area including first and second conductive areas on one surface of a semiconductor substrate, a passivation film having opening and an electrode including a first electrode connected to the first conductive area and a second electrode connected to the second conductive area, the electrode including an adhesive layer on the semiconductor substrate or the conductive area, an electrode layer on the adhesive layer and including a metal, and a barrier layer disposed on the electrode layer and including a metal that is different from the metal of the electrode layer, the electrode layer having a thickness greater than a thickness of each of the adhesive layer and the barrier layer, a width of the electrode layer being larger than a width of the opening, and the barrier layer having a higher melting point than a melting point of the electrode layer.

19 Claims, 6 Drawing Sheets

(51) Int. Cl.
*H01L 31/05* (2014.01)
*H01L 31/0747* (2012.01)
*H01L 31/02* (2006.01)
*H01L 31/0203* (2014.01)
*H01L 31/18* (2006.01)

(52) U.S. Cl.
CPC .. *H01L 31/022441* (2013.01); *H01L 31/0516* (2013.01); *H01L 31/0747* (2013.01); *H01L 31/1804* (2013.01); *Y02E 10/50* (2013.01)

(56) References Cited

U.S. PATENT DOCUMENTS

| | | | | |
|---|---|---|---|---|
| 2012/0060911 | A1* | 3/2012 | Fu | H01L 31/068 |
| | | | | 136/256 |
| 2012/0234593 | A1* | 9/2012 | Bottenberg | B32B 15/04 |
| | | | | 174/268 |
| 2014/0162399 | A1 | 6/2014 | Cudzinovic et al. | |
| 2014/0332759 | A1* | 11/2014 | Meinhold | H01L 51/5203 |
| | | | | 257/40 |
| 2016/0380126 | A1* | 12/2016 | Barkhouse | H01L 31/02244 |
| | | | | 136/256 |

FOREIGN PATENT DOCUMENTS

| | | |
|---|---|---|
| CN | 104335357 A | 2/2015 |
| CN | 104638030 A | 5/2015 |
| EP | 2 871 682 A1 | 5/2015 |
| EP | 2 922 098 A1 | 9/2015 |
| JP | 2006-324590 A | 11/2006 |
| JP | 2013-12606 A | 1/2013 |
| JP | 2015-95653 A | 5/2015 |
| KR | 10-2011-0080230 A | 7/2011 |

\* cited by examiner

SOLAR CELL

CROSS-REFERENCE TO RELATED APPLICATIONS

This application is a Divisional of U.S. patent application Ser. No. 15/220,172, filed on Jul. 26, 2016, which claims the priority benefit of Korean Patent Applications No. 10-2015-0105964, filed on Jul. 27, 2015 and No. 10-2016-0090036, filed on Jul. 15, 2016 in the Korean Intellectual Property Office, the entire contents of all of these applications are hereby expressly incorporated by reference into the present application.

BACKGROUND OF THE INVENTION

Field of the Invention

The present inventive concept relates to a solar cell, and more particularly, to a solar cell having an improved electrode structure.

Discussion of the Background Art

Recently, due to depletion of existing energy resources, such as oil and coal, interest in alternative sources of energy to replace the existing energy resources is increasing. Most of all, solar cells are popular next generation cells to convert sunlight into electrical energy.

Solar cells may be manufactured by forming various layers and electrodes based on some design. The efficiency of solar cells may be determined by the design of the various layers and electrodes. In order for solar cells to be commercialized, the problem of low efficiency needs to be overcome, and thus, there is a demand to design the various layers and electrodes so as to maximize the efficiency of solar cells and to be manufactured via a simplified method.

SUMMARY OF THE INVENTION

Therefore, the present inventive concept has been made in view of the above problems, and it is an object of the present inventive concept to provide a solar cell capable of increasing efficiency thereof.

According to an aspect of the present inventive concept, the above and other objects can be accomplished by the provision of a solar cell including a semiconductor substrate, a conductive area including first and second conductive areas disposed on one surface of the semiconductor substrate, and an electrode including a first electrode connected to the first conductive area and a second electrode connected to the second conductive area, wherein the electrode includes an adhesive layer disposed on the semiconductor substrate or the conductive area, an electrode layer disposed on the adhesive layer and including a metal as a main component, and a barrier layer disposed on the electrode layer and including a metal that is different from the metal of the electrode layer as a main component, wherein the electrode layer has a thickness greater than a thickness of each of the adhesive layer and the barrier layer, and wherein the barrier layer has a higher melting point than a melting point of the electrode layer.

BRIEF DESCRIPTION OF THE DRAWINGS

The above and other objects, features and other advantages of the present inventive concept will be more clearly understood from the following detailed description taken in conjunction with the accompanying drawings, in which.

DETAILED DESCRIPTION OF THE INVENTION

Figure 1:
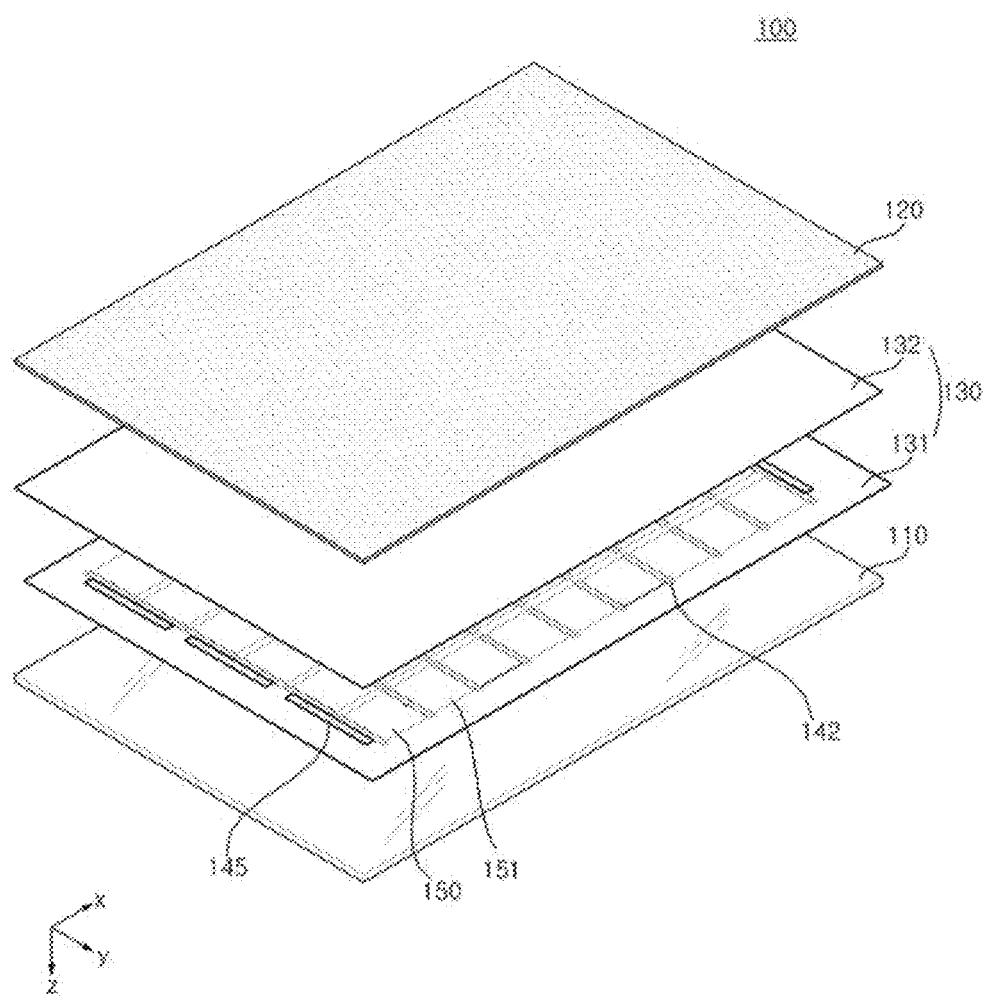
FIG. 1 is a rear perspective view illustrating a solar cell panel according to an embodiment of the present inventive concept.

Reference will now be made in detail to the preferred embodiments of the present inventive concept, examples of which are illustrated in the accompanying drawings. However, it will be understood that the present inventive concept should not be limited to the embodiments and may be modified in various ways.

In the drawings, to clearly and briefly explain the present inventive concept, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the present inventive concept are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a solar cell and an electrode used therein according to the embodiments of the present inventive concept will be described in detail with reference to the accompanying drawings. A solar cell panel will first be described in detail, and then a solar cell included in the solar cell panel and an electrode used in the solar cell will be described in detail.

FIG. 1 is a rear perspective view illustrating a solar cell panel according to an embodiment of the present inventive concept.

Referring to FIG. 1, the solar cell panel according to the present embodiment, designated by reference numeral 100, may include a solar cell 150, a first substrate 110 disposed on a first surface of the solar cell 150 (hereinafter referred to as a "front substrate"), and a second substrate 120 disposed on a second surface of the solar cell 150 (hereinafter referred to as a "back substrate"). In addition, the solar cell panel 100 may include a first sealing member 131 between the solar cell 150 and the front substrate 110, and a second sealing member 132 between the solar cell 150 and the back substrate 120. This will be described below in more detail.

First, the solar cell 150 may include a photoelectric converter for converting sunlight into electrical energy, and an electrode electrically connected to the photoelectric converter for collecting and transmitting current. In the present embodiment, for example, the photoelectric converter may include a semiconductor substrate (e.g. silicon wafer) or a semiconductor layer (e.g. silicon layer). The solar cell 150 having the structure described above will be described later in detail with reference to FIGS. 2 to 4.

The solar cell 150 may include a ribbon (or interconnector) 142, and may be electrically interconnected in series and/or in parallel by the ribbon 142. This will be described below with reference to first and second solar cells 150 and 151, which are adjacent to each other, by way of example. That is, the ribbon 142 may interconnect a first electrode (see reference numeral 42 in FIG. 2) of the first solar cell 150 and a second electrode (see reference numeral 44 in FIG. 2) of the second solar cell 151, which is adjacent to the first solar cell 150. Various structures may be applied to, for example, the connection structure of the ribbon 142, the first electrode 42 of the first solar cell 150, and the second electrode 44 of the second solar cell 151. In one example, in the first and second solar cells 150 and 151, the first electrodes 42 may be arranged on the first edge and connected to one another along the first edge, and second electrodes 44 may be arranged on the second edge, which is opposite the first edge, and connected to one another along the second edge. As such, ribbons 142 may be formed across the edges of the first and second solar cells 150 and 151 so as to interconnect the first electrodes 42, arranged on the first edge of the first solar cell 150, and the second electrodes 44, arranged on the second edge of the second solar cell 151, which is adjacent to the first solar cell 150, and may extend along the first and second edges. At this time, in order to prevent short-circuits between the ribbon 142 and the first and second solar cells 150 and 151, an insulation film (not illustrated) may be interposed in some portions between the ribbon 142 and the first and second solar cells 150 and 151, and a portion of the ribbon 142, which protrudes from the insulation film, may be connected to the first electrode 42 or to the second electrode 44. However, the present inventive concept is not limited thereto, and various alterations are possible.

In addition, bus ribbons 145 interconnect alternate ends of the ribbons 142 connecting the solar cells 150 to one another in a single row (in other words, constituting a solar cell string). The bus ribbons 145 may be located on an end of the solar cell string so as to cross the solar cell string. The bus ribbons 145 may interconnect adjacent solar cell strings, or may connect solar cell string(s) to a junction box (not illustrated), which prevents the backflow of current. The material, shape, connection structure, and the like of the bus ribbons 145 may be altered in various ways, and the present inventive concept is not limited as to them.

A sealing member 130 may include the first sealing member 131 disposed on the front surface of the solar cell 150 and the second sealing member 132 disposed on the back surface of the solar cell 150. The first sealing member 131 and the second sealing member 132 prevent the introduction of moisture and oxygen, and realize a chemical bond between respective elements of the solar cell panel 100. The first and second sealing members 131 and 132 may be formed of an insulation material having light-transmissive and adhesive properties. In one example, the first sealing member 131 and the second sealing member 132 may be formed of ethylene vinyl acetate (EVA) copolymer resin, polyvinyl butyral, silicone resin, ester-based resin, or olefin-based resin. Through, for example, a lamination process using the first and second sealing members 131 and 132, the back substrate 120, the second sealing member 132, the solar cell 150, the first sealing member 131, and the front substrate 110 may be integrated with one another so as to construct the solar cell panel 100.

The front substrate 110 is disposed on the first sealing member 131 and configures the front surface of the solar cell panel 100. The back substrate 120 is disposed on the second sealing member 132 and configures the back surface of the solar cell panel 100. Each of the front substrate 110 and the back substrate 120 may be formed of an insulation material capable of protecting the solar cell 150 from external shocks, moisture, ultraviolet light, and the like. In addition, the front substrate 110 may be formed of a light-transmitting material capable of transmitting light, and the back substrate 120 may be configured as a sheet formed of a light-transmitting material, a material not transmitting light, or a material reflecting light. In one example, the front substrate 110 may be configured as a glass substrate, and the back substrate 120 may be a Tedlar/PET/Tedlar (TPT) substrate, or may include a polyvinylidene fluoride (PVDF) resin layer formed on at least one surface of a base film (e.g. a polyethyleneterephthlate (PET) film).

However, the present inventive concept is not limited thereto. Thus, the first and second sealing members 132 and 132, the front substrate 110, or the back substrate 120 may include any of various materials excluding the above-described materials, and may have any of various shapes excluding the above-described shapes. For example, the front substrate 110 or the back substrate 120 may have any of various shapes (e.g. a substrate, film, or sheet), or may include any of various materials.

The structure of the solar cell 150 described above will be described below in detail with reference to FIGS. 2 to 4.

Figure 2:
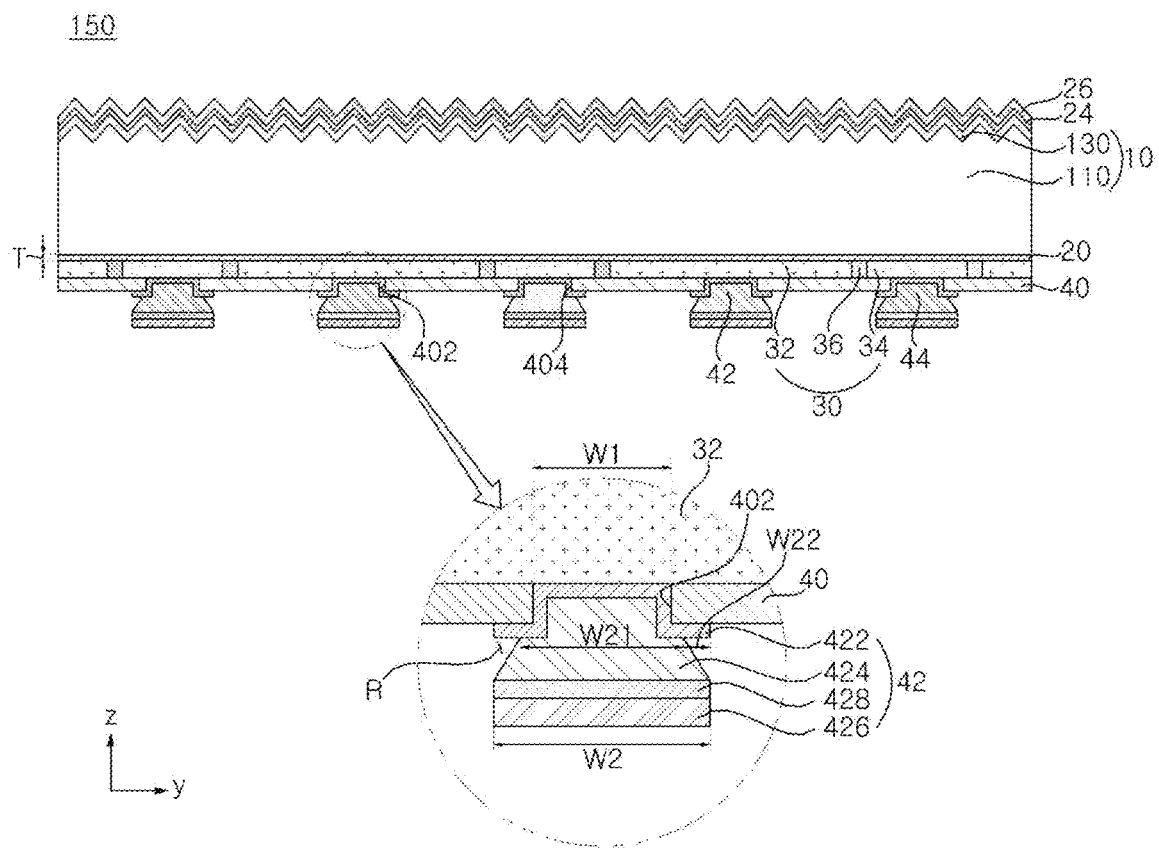
FIG. 2 is a sectional view illustrating a solar cell according to an embodiment of the present inventive concept.
Figure 3:
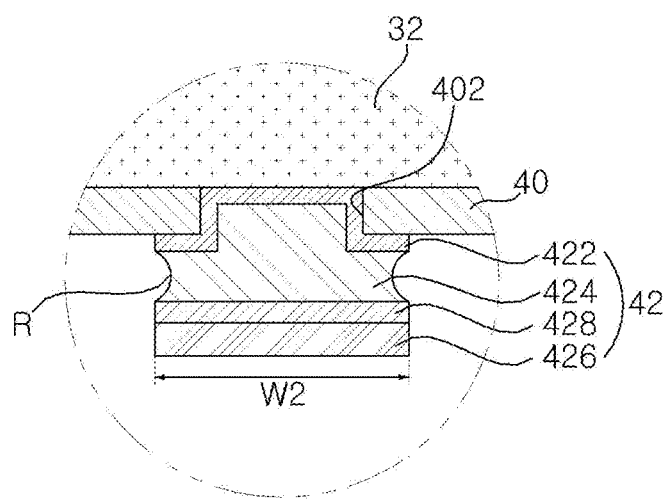
FIG. 3 is an enlarged sectional view illustrating a first electrode in a solar cell according to another embodiment of the present inventive concept.

FIG. 2 is a sectional view illustrating the solar cell 150 according to an embodiment of the present inventive concept, and FIG. 3 is an enlarged sectional view illustrating a first electrode in a solar cell according to another embodiment of the present inventive concept. In addition, FIG. 4 is a partial rear plan view of the solar cell 150 illustrated in FIG. 2. For reference, for clear and brief description, in FIG. 3, only parts corresponding to the enlarged circle of FIG. 2 are illustrated.

Referring to FIG. 2, the solar cell 150 according to the present embodiment includes a semiconductor substrate 10 having a base area 110, a tunneling layer 20 disposed on one surface of the semiconductor substrate 10 (e.g. the back surface of the semiconductor substrate 10), conductive areas 32 and 34 disposed over the tunneling layer 20, and electrodes 22 and 24 connected to the conductive areas 32 and 34. In addition, the solar cell 150 may further include a passivation film 24 (or front-surface passivation film), an anti-reflection film 26, and a passivation film 40 (or back-surface passivation film). This will be described below in more detail.

The semiconductor substrate 10 may include the base area 110, which includes a second conductive dopant at a relatively low doping concentration, thus being of a second conductive type. The base area 110 may be formed of crystalline semiconductors including the second conductive dopant. In one example, the base area 110 may be formed of monocrystalline or polycrystalline semiconductors (e.g. monocrystalline or polycrystalline silicon) including the second conductive dopant. More particularly, the base area 110 may be formed of monocrystalline semiconductors including the second conductive dopant (e.g. a monocrystalline semiconductor wafer, and more specifically, a semiconductor silicon wafer). The use of the base area 110 or the semiconductor substrate 10 having high crystallinity and thus low defects ensures excellent electrical properties.

The second conductive type may be a p-type or n-type. In one example, when the base area 110 is of an n-type, a p-type first conductive area 32, which forms a junction with the base area 110 for forming carriers via photoelectric conversion (e.g. pn junction with the base area 110 with the tunneling layer 20 interposed therebetween), may be widely formed in order to increase a photoelectric conversion area. In addition, in this case, the first conductive area 32 having a wide area may effectively collect holes, which move relatively slowly, thereby contributing to an increase in photoelectric conversion efficiency. However, the present inventive concept is not limited thereto.

In addition, the semiconductor substrate 10 may include a front-surface field area (or field area) 130 disposed on the other surface (hereinafter referred to as the "front surface") of the semiconductor substrate 10. The front-surface field area 130 may be of the same conductive type as the base area 110, but may have a higher doping concentration than in the base area 110.

The present embodiment illustrates the configuration in which the front-surface field area 130 is configured as a doped area formed by doping the semiconductor substrate 10 with the second conductive dopant at a relatively high doping concentration. As such, the front-surface field area 130 includes crystalline (monocrystalline or polycrystalline) semiconductors of the second conductive type and constitutes a portion of the semiconductor substrate 10. In one example, the front-surface field area 130 may constitute a portion of a monocrystalline semiconductor substrate (e.g. a monocrystalline silicon wafer) of the second conductive type.

At this time, the doping concentration of the front-surface field area 130 may be less than the doping concentration of the second conductive area 34, which is of the same second conductive type as the front-surface field area 130. This is because it is permissible for the front-surface field area 130 to have a relatively low doping concentration because the front-surface field area 130 needs to be doped in order to prevent carriers from moving to the front surface of the semiconductor substrate 10 or to allow carriers to move horizontally. However, the present inventive concept is not limited thereto, and the front-surface field area 130 and the second conductive area 34 may have different doping concentrations.

However, the present inventive concept is not limited thereto. Thus, the front-surface field area 130 may be formed by doping a semiconductor layer (e.g. an amorphous semiconductor layer, microcrystalline semiconductor layer, or polycrystalline semiconductor layer), separate from the semiconductor substrate 10, with the second conductive dopant. Alternatively, the front-surface field area 130 may serve similar to a layer (e.g. the front-surface passivation film 24 and/or the anti-reflection film 26), which is formed adjacent to the semiconductor substrate 10 and doped with a fixed charge. For example, when the base area 110 is of the n-type, the front-surface passivation film 24 may be formed of an oxide having a negative fixed charge (e.g. an aluminum oxide) so as to form an inversion layer on the surface of the base area 110, thereby serving as a field area. In this case, the semiconductor substrate 10 may include only the base area 110 without a separate doped area, which may minimize defects of the semiconductor substrate 10. Various other configurations of the front-surface field area 130 may be formed using various other methods.

In the present embodiment, the front surface of the semiconductor substrate 10 may be subjected to texturing so as to have protrusions, such as pyramids. The resulting texture formed on the semiconductor substrate 10 may have a given shape (e.g. a pyramidal shape) having an outer surface formed on a specific crystal face (e.g. (111) face) of semiconductors. When the roughness of the front surface of the semiconductor substrate 10 is increased by the protrusions formed on the front surface via texturing, the reflectance of light introduced through the front surface of the semiconductor substrate 10 may be reduced. Accordingly, the quantity of light, which reaches the pn junction formed by the base area 110 and the first conductive area 32, may be increased, which may minimize the loss of light.

In addition, the back surface of the semiconductor substrate 10 may be formed via, for example, mirror surface grinding, and thus may be a relatively smooth flat surface, which has a lower surface roughness than the front surface. In the case where both the first and second conductive areas 32 and 34 are formed on the back surface of the semiconductor substrate 10 as in the present embodiment, the properties of the solar cell 150 may be greatly changed according to the properties of the back surface of the semiconductor substrate 10. Therefore, the back surface of the semiconductor substrate 10 may have no protrusion formed via texturing in order to improve passivation, which may consequently improve the properties of the solar cell 150. However, the present inventive concept is not limited thereto. In some cases, the back surface of the semiconductor substrate 10 may be provided with protrusions via texturing. Various other alterations are possible.

The tunneling layer 20 may be formed over the back surface of the semiconductor substrate 10. In one example, the tunneling layer 20 may come into contact with the back surface of the semiconductor substrate 10, thus achieving a simplified stricture and improved tunneling effects. However, the present inventive concept is not limited thereto.

The tunneling layer 20 may serve as a barrier for electrons and holes, thereby preventing minority carriers from passing therethrough and allowing only majority carriers, which accumulate at a portion adjacent to the tunneling layer 20 and thus have a given amount of energy or more, to pass therethrough. At this time, the majority carriers, which have the given amount of energy or more, may easily pass through the tunneling layer 20 owing to tunneling effects. In addition, the tunneling layer 20 may serve as a diffusion barrier, which prevents the dopant of the conductive areas 32 and 34 from diffusing into the semiconductor substrate 10. The tunneling layer 20 may include various materials to enable the tunneling of the majority carriers. In one example, the tunneling layer 20 may include an oxide, nitride, semiconductor, or conductive polymer. For example, the tunneling layer 20 may include a silicon oxide, silicon nitride, silicon oxide nitride, intrinsic amorphous silicon, or intrinsic polycrystalline silicon. In particular, the tunneling layer 20 may be configured as a silicon oxide layer including a silicon oxide. This is because the silicon oxide layer has excellent passivation and thus ensures easy tunneling of carriers.

In order to achieve sufficient tunneling effects, the tunneling layer 20 may be thinner than the back-surface passivation film 40. In one example, the thickness of the tunneling layer 20 may be 5 nm or less (more specifically, 2 nm or less, for example, within a range from 0.5 nm to 2 nm). When the thickness of the tunneling layer 20 exceeds 5 nm, smooth tunneling does not occur, and consequently, the solar cell 150 may not operate. When the thickness of the tunneling layer 20 is below 0.5 nm, it may be difficult to form the tunneling layer 20 having a desired quality. Accordingly, in order to further improve tunneling effects, the thickness of the tunneling layer 20 may be 2 nm or less (more specifically, within a range from 0.5 nm to 2 nm). However, the present inventive concept is not limited thereto, and the thickness of the tunneling layer 20 may have any of various values.

A semiconductor layer 30, which includes the conductive areas 32 and 34, may be disposed over the tunneling layer 20. In one example, the semiconductor layer 30 may come into contact with the tunneling layer 20, thus having a simplified structure and maximizing tunneling effects. However, the present inventive concept is not limited thereto.

In the present embodiment, the semiconductor layer 30 includes the first conductive area 32, which includes a first conductive dopant and thus is of a first conductive type, and the second conductive area 34, which includes the second conductive dopant and thus is of the second conductive type. The first conductive area 32 and the second conductive area 34 may be arranged in the same plane over the tunneling layer 20. That is, no layer may be interposed between the first and second conductive areas 32 and 34 and the tunneling layer 20. Alternatively, when any layer is interposed between the first and second conductive areas 32 and 34 and the tunneling layer 20, the interposed layer may have the same stacking structure. In addition, a barrier area 36 may be located between the first conductive area 32 and the second conductive area 34 in the same plane as the conductive areas 32 and 34.

The first conductive area 32 configures an emitter area, which forms the pn junction (or pn tunnel junction) with the base area 110 with the tunneling layer 20 interposed therebetween, so as to generate carriers via photoelectric conversion.

At this time, the first conductive area 32 may include semiconductors (e.g. silicon) including the first conductive dopant, which is contrary to that of the base area 110. In the present embodiment, the first conductive area 32 is configured as a semiconductor layer, which is separately formed over the semiconductor substrate 10 (more particularly, over the tunneling layer 20) and which is doped with the first conductive dopant. As such, the first conductive area 32 may be configured as a semiconductor layer, which has a different crystalline structure from that of the semiconductor substrate 10 so as to be easily formed on the semiconductor substrate 10. For example, the first conductive area 32 may be formed by doping, for example, an amorphous semiconductor, microcrystalline semiconductor, or polycrystalline semiconductor (e.g. amorphous silicon, microcrystalline silicon, or polycrystalline silicon), which may be easily fabricated via various methods such as, for example, deposition, with the first conductive dopant. The first conductive dopant may be introduced into the semiconductor layer while the semiconductor layer is formed, or after the semiconductor layer is formed, via any of various doping methods, such as thermal diffusion or ion implantation.

At this time, the first conductive area 32 may include the first conductive dopant, which may exhibit a conductive type contrary to that of the base area 110. That is, when the first conductive dopant is a p-type dopant, a group-III element, such as boron (B), aluminum (Al), gallium (ga), or indium (In), may be used. When the first conductive dopant is an n-type dopant, a group-V element, such as phosphorus (P), arsenic (As), bismuth (Bi), or antimony (Sb), may be used. In one example, the first conductive dopant may be boron (B), which is of a p-type.

The second conductive area 34 serves as a back-surface field area, which forms a back-surface field to prevent the loss of carriers from the surface of the semiconductor substrate 10 (more accurately, the back surface of the semiconductor substrate 10) due to recombination.

At this time, the second conductive area 34 may include a semiconductor (e.g. silicon), which includes the same second conductive dopant as the base area 110. In the present embodiment, the second conductive area 34 is configured as a semiconductor layer, which is separately formed over the semiconductor substrate 10 (more clearly, over the tunneling layer 20) and which is doped with the second conductive dopant. As such, the second conductive area 34 may be configured as a semiconductor layer having a crystalline structure, which is different from that of the semiconductor substrate 10, so as to be easily formed on the semiconductor substrate 10. For example, the second conductive area 34 may be formed by doping, for example, an amorphous semiconductor, microcrystalline semiconductor, or polycrystalline semiconductor (e.g. amorphous silicon, microcrystalline silicon, or polycrystalline silicon), which may be easily fabricated via various methods such as, for example, deposition, with the second conductive dopant. The second conductive dopant may be introduced into the semiconductor layer while the semiconductor layer is formed, or after the semiconductor layer is formed, via any of various doping methods, such as thermal diffusion or ion implantation.

At this time, the second conductive area 34 may include the second conductive dopant, which may exhibit the same conductive type as the base area 110. That is, when the second conductive dopant is an n-type dopant, a group-V element, such as phosphorus (P), arsenic (As), bismuth (Bi), or antimony (Sb), may be used. When the second conductive dopant is a p-type dopant, a group-III element, such as boron (B), aluminum (Al), gallium (ga), or indium (In), may be used. In one example, the second conductive dopant may be phosphorus (P), which is of an n-type.

In addition, the barrier area 36 is located between the first conductive area 32 and the second conductive area 34 so that the first conductive area 32 and the second conductive area 34 are spaced apart from each other. When the first conductive area 32 and the second conductive area 34 come into contact with each other, shunts occur, undesirably causing deterioration in the performance of the solar cell 150. However, in the present embodiment, it is possible to prevent unnecessary shunts by positioning the barrier area 36 between the first conductive area 32 and the second conductive area 34.

Here, in the present embodiment, any one of the first conductive area 32 and the second conductive area 34 may be additionally disposed on (e.g. in contact with) the side surface of the semiconductor substrate 10.

The barrier area 36 may include any of various materials, which may be located between the first conductive area 32 and the second conductive area 34 so as to substantially insulate the conductive areas 32 and 34 from each other. That is, the barrier area 36 may be formed of an undoped insulation material (e.g. an oxide or nitride). Alternatively, the barrier area 36 may include an intrinsic semiconductor. At this time, the first conductive area 32, the second conductive area 34 and the barrier area 36 may be formed of the same semiconductor (e.g. amorphous silicon, microcrystalline silicon or polycrystalline silicon), which is continuously formed such that side surfaces of the three areas 32, 34 and 36 come into contact with one another. The barrier area 36 may include an i-type (intrinsic) semiconductor material, which substantially includes no dopant. In one example, after a semiconductor layer including a semiconductor material is formed, an area of the semiconductor layer is doped with the first conductive dopant so as to form the first conductive area 32 and another area of the semiconductor layer is doped with the second conductive dopant so as to form the second conductive area 34, whereby the remaining area in which the first conductive area 32 and the second conductive area 34 are not formed may configure the barrier area 36. In this way, the manufacture of the first conductive area 32, the second conductive area 34, and the barrier area 36 may be simplified.

However, the present inventive concept is not limited thereto. Thus, when the barrier area 36 is formed separately from the first conductive area 32 and the second conductive area 34, the thickness of the barrier area 36 may differ from those of the first conductive area 32 and the second conductive area 34. In one example, in order to more effectively prevent short-circuit between the first conductive area 32 and the second conductive area 34, the barrier area 36 may be thicker than the first conductive area 32 and the second conductive area 34. Alternatively, in order to reduce the amount of a raw material required to form the barrier area 36, the barrier area 36 may be thinner than the first conductive area 32 and the second conductive area 34. Of course, various other alterations are possible. In addition, the basic constituent material of the barrier area 36 may differ from those of the first conductive area 32 and the second conductive area 34.

In addition, the present embodiment illustrates the configuration in which the barrier area 36 causes the first conductive area 32 and the second conductive area 34 to be wholly spaced apart from each other. However, the present inventive concept is not limited thereto. Accordingly, the barrier area 36 may be formed to cause the first conductive area 32 and the second conductive area 34 to be spaced apart from each other only along a portion of the boundary therebetween. Thereby, the conductive areas 32 and 34 may come into contact with each other along the remaining portion of the boundary therebetween.

Here, the first conductive area 32, which is of a different conductive type from that of the base area 110, may be wider than the second conductive area 34, which is of the same conductive type as the base area 110. As such, the pn junction, which is formed through the tunneling layer 20 between the base area 110 and the first conductive area 32, may have an increased width. At this time, when the conductive type of the base area 110 and the second conductive area 34 is an n-type and the conductive type of the first conductive area 32 is a p-type, the wide first conductive area 32 may effectively collect holes, which move relatively slowly. The plan configuration of the first conductive area 32, the second conductive area 34, and the barrier area 36 will be described below in more detail with reference to FIG. 4.

The back-surface passivation film 40 may be formed over the first and second conductive areas 32 and 34 and the barrier area 36 on the back surface of the semiconductor substrate 10. In one example, the back-surface passivation film 40 may come into contact with the first and second conductive areas 32 and 34 and the barrier area 36, thus having a simplified structure. However, the present inventive concept is not limited thereto.

The back-surface passivation film 40 has an opening 402 for connection of the first conductive area 32 and the first electrode 42 and an opening 404 for connection of the second conductive area 34 and the second electrode 44. As such, the back passivation film 40 serves to prevent the first conductive area 32 and the second conductive area 34 from being connected to the incorrect electrode (i.e. the second electrode 44 in the case of the first conductive area 32 and the first electrode 42 in the case of the second conductive area 34). In addition, the back-surface passivation film 40 may be used for the passivation of the first and second conductive areas 32 and 34 and/or the barrier area 36.

The back-surface passivation film 40 may be disposed over a portion of the semiconductor layer 30 on which the electrodes 42 and 44 are not located. The back passivation film 40 may be thicker than the tunneling layer 20. As such, the insulation and passivation properties of the back-surface passivation film 40 may be improved. Various other alterations are possible.

The back-surface passivation film 40 may be formed of any of various insulation materials (e.g. an oxide or nitride). In one example, the back-surface passivation film 40 may include a single film or multiple films in the form of a combination of two or more films selected from the group consisting of a silicon nitride film, silicon nitride film containing hydrogen, silicon oxide film, silicon oxide nitride film, silicon carbide film, $Al_2O_3$, $MgF_2$, ZnS, $TiO_2$, and $CeO_2$. For example, the back-surface passivation film 40 may take the form of a stack in which a silicon nitride film and a silicon carbide film are stacked one above another. However, the present inventive concept is not limited thereto and the back-surface passivation film 40 may of course be formed of any of various other materials.

In one example, in the present embodiment, the back-surface passivation film 40, the front-surface passivation film 24, and/or the anti-reflection film 26 may not include a dopant in order to achieve excellent insulation and passivation properties.

The electrodes 42 and 44, disposed on the back surface of the semiconductor substrate 10, include the first electrode 42, which is electrically and physically connected to the first conductive area 32, and the second electrode 44, which is electrically and physically connected to the second conductive area 34.

At this time, the first electrode 42 passes through the first opening 402 of the back-surface passivation film 40 and is connected to the first conductive area 32, and the second electrode 44 passes through the second opening 404 of the back-surface passivation film 40 and is connected to the second conductive area 34. The first and second electrodes 42 and 44 may include various metal materials. In addition, the first and second electrodes 42 and 44 may have any of various plan shapes such that they are not electrically connected to each other, but are connected respectively to the first conductive area 32 and the second conductive area 34 so as to collect produced carriers and to transmit the carriers to the outside. That is, the present inventive concept is not limited as to the plan shape of the first and second electrodes 42 and 44.

Hereinafter, the stacking structure of the first electrode 42 and/or the second electrode 44 will be described in detail with reference to the enlarged circles of FIGS. 2 and 3, and then the plan structure of the first electrode 42 and/or the second electrode 44 will be described in detail with reference to FIG. 4. Although the enlarged circle of FIGS. 2 and 3 and the following description are focused on the first electrode 42 by way of example, the second electrode 44 may have the same or extremely similar structure. Thus, the stacking structure of the first electrode 42 described below may be applied to the second electrode 44.

Referring to the enlarged circle of FIG. 2, the first electrode 42 includes an adhesive layer 422 disposed over the semiconductor layer 30, which configures the first conductive area 32 (the second conductive area 34 in the case of the second electrode 44), an electrode layer 424, which is disposed over the adhesive layer 422 and includes a metal as a main component (i.e. a material included at the largest rate, e.g. a material included in an amount of 50 weight parts or more), and a barrier layer 428, which is disposed over the electrode layer 424, includes a metal different from that of the electrode layer 424 as a main component, and has a higher melting point than the electrode layer 424. In addition, a pad layer (or a ribbon connection layer) 426 may be disposed over the barrier layer 428. Here, the electrode layer 424 performs the basic role of an electrode that collects carriers produced by photoelectric conversion and transmits the same to the outside, and therefore, has a greater thickness than each of the adhesive layer 422 and the barrier layer 428. In addition, the adhesive layer 422 serves to improve, for example, adhesion between the first conductive area 32 and the electrode layer 424, and the pad layer 426 is used as the layer that is connected to the ribbon 142.

The adhesive layer 422 may be located between (e.g. in contact with) the semiconductor layer 30 and the electrode layer 424. The adhesive layer 422 may include a metal, which is conductive and has excellent contact with the semiconductor layer 30. As such, adhesion between the semiconductor layer 30 and the electrode layer 424 may be improved without deterioration in the conductivity of the first electrode 42. In order to improve the contact between the adhesive layer 422 and the semiconductor layer 30, the coefficient of thermal expansion of the adhesive layer 422 may have a value between the coefficient of thermal expansion of the semiconductor layer 30 and the coefficient of thermal expansion of the portion of the electrode layer 424 that is adjacent to the adhesive layer 422.

Considering the above description in more detail, when the difference in the coefficient of thermal expansion between the semiconductor layer 30 and the first electrode 42 is large, interface contact between the semiconductor layer 30 and the first electrode 42 may be deteriorated during various thermal-treatment processes (annealing) for forming the solar cell 150. Thereby, the contact resistance between the semiconductor layer 30 and the first electrode 42 may increase. This may be a serious problem when the line width of the semiconductor layer 30 or the first electrode 42 is reduced such that the contact area between the semiconductor layer 30 and the first electrode 42 is reduced. Accordingly, in the present embodiment, the coefficient of thermal expansion of the adhesive layer 422 of the first electrode 42, which comes into contact with the semiconductor layer 30, may be limited so as to reduce the difference in the coefficient of thermal expansion between the semiconductor layer 30 and the first electrode 42, thereby achieving improved interface contact.

When the semiconductor layer 30 includes silicon, the coefficient of thermal expansion thereof ranges from about 2.6 to 2.9 ppm/K. The coefficient of thermal expansion of, for example, copper (Cu), aluminum (Al), silver (Ag) or gold (Au), which may form a portion of the electrode layer 424 adjacent to the adhesive layer 422 (for example, in the present embodiment, which may form the electrode layer 424), is about 14.2 ppm/K or more. More specifically, the coefficient of thermal expansion of copper is about 16.5 ppm/K, the coefficient of thermal expansion of aluminum is about 23.0 ppm/K, the coefficient of thermal expansion of silver is about 19.2 ppm/K, and the coefficient of thermal expansion of gold is about 14.2 PPm/K.

In consideration of the above description, the coefficient of thermal expansion of a material (e.g. a metal) constituting the adhesive layer 422 may range from about 4.5 ppm/K to about 14 ppm/K (e.g. range from 4.5 ppm/K to 10 ppm/K). When the coefficient of thermal expansion of copper is below 4.5 ppm/K, or exceeds 14 ppm/K, improving adhesion by reducing the difference in the coefficient of thermal expansion between the semiconductor layer 30 and the adhesive layer 422 may be insufficient. At this time, when the coefficient of thermal expansion ranges from 4.5 ppm/K to 10 ppm/K, the adhesive layer 422 may exert further improved effects.

In one example, the adhesive layer 422 may include, as a main component, titanium (Ti) having the coefficient of thermal expansion of about 8.4 ppm/K, molybdenum (Mo) having the coefficient of thermal expansion within a range from about 4.5 ppm/K to 4.6 ppm/K, chrome (Cr) having the coefficient of thermal expansion within a range from about 4.9 ppm/K to 8.2 ppm/K, or tungsten (W) having the coefficient of thermal expansion of about 4.6 ppm/K. In one example, the adhesive layer 422 may include titanium, molybdenum, chrome, or tungsten in an amount from 90 weight parts to 100 weight parts. For example, the adhesive layer 422 may include titanium, molybdenum, chrome or tungsten in the state of a single metal, rather than an alloy, so as to effectively realize desired properties. However, the present inventive concept is not limited thereto, and the adhesive layer 422 may be formed of an alloy including at least one of titanium, molybdenum, chrome, and tungsten.

At this time, tungsten is expensive and may greatly increase manufacturing costs, and chrome may become a target of various regulations due to, for example, hexavalent chrome, which may have a bad effect on the environment. Therefore, the adhesive layer 422 may be formed of titanium, molybdenum, or chrome, and more specifically, may be formed of titanium or molybdenum. In particular, molybdenum has a lower specific resistance than titanium, and thus may greatly improve the electrical connection between the first electrode 42 and the semiconductor layer 30.

When the adhesive layer 422 includes titanium, molybdenum, chrome, or tungsten, contact between the semiconductor layer 30 and the first electrode 42 may be improved via a reduction in the difference between the coefficients of thermal expansion thereof. In addition, because the adhesive layer 422 is formed of titanium, molybdenum, chrome or tungsten and thus has a higher melting point than the electrode layer 424, the adhesive layer 422 may function as a barrier for preventing the constituent material of the electrode layer 424 (e.g. aluminum or copper) from diffusing into the semiconductor layer 30 or the semiconductor substrate 10 at a temperature higher than room temperature.

Thereby, any problem caused when the constituent material of the electrode layer 424 diffuses into the semiconductor layer 30 or the semiconductor substrate 10 may be prevented. In particular, titanium, molybdenum, chrome or tungsten is a refractory metal and has a high melting point, and therefore requires a great amount of energy for the diffusion of elements or the like. Accordingly, the diffusion of elements may be effectively prevented even if the temperature is increased. Here, the refractory metal means a material that has a higher melting point than the melting point (about 1537° C.) of iron.

For example, the melting point of titanium is about 1670° C., the melting point of molybdenum is about 1670° C., the melting point of chrome is about 1860° C., and the melting point of tungsten is about 3422° C. On the other hand, with regard to a constituent material of the electrode layer 424, the melting point of copper is about 1084° C., the melting point of aluminum is about 660° C., the melting point of silver is about 961° C., and the melting point of gold is about 1063° C. As such, the electrode layer 424 includes a metal, rather than a refractory metal, as a main component, and the adhesive layer 422 includes a refractory metal, which has a higher melting point than the electrode layer 424, as a main component.

Meanwhile, a long wavelength region of light s mainly reflected by the passivation film 40. Therefore, if the thickness of the adhesive layer 422 exceeds a certain level, due to the light absorption of the adhesive layer 422, the reflectance of the light in the long wavelength region of the passivation film 40 is reduced. Accordingly, the efficiency of the solar cell also decreases. Thus, by limiting the thickness of the adhesive layer 422, it is possible to improve the efficiency of the solar cell 150.

Also, the adhesive layer 422 is compared with the first-conductivity-type region 32, it may be formed of a material having a relatively high resistance. Thus, if the thickness of the adhesive layer 422 exceeds a certain level, the carrier is hard to move from the first conductive area 32 to the electrode layer (424). Thus, if limited to a thickness of the adhesive layer (422) below a certain level, the mobility of the carrier (electrons or holes) can be enhanced, therefore it is possible to improve the efficiency of the solar cell.

Meanwhile, the adhesive layer 422 may be thinner than the electrode layer 424. Although the present embodiment illustrates the electrode layer 424 formed in a single layer, the present inventive concept is not limited thereto. Thus, a plurality of electrode layers 424 may be provided. In this case, the thickness of the adhesive layer 422 may be less than the thickness of each of the electrode layers 424. Specifically, the thickness of the adhesive layer 422 may be 50 nm or less. When the thickness of the adhesive layer 422 exceeds 50 nm, the electrical resistance of the adhesive layer 422 may be increased, and thus the mobility of the carrier directed to the electrode layer 424 may be deteriorated. The mobility of the carrier of the adhesive layer 422 may be further increased when the thickness of the adhesive layer 422 is 20 nm or less. Here, the thickness of the adhesive layer 422 may range from 1 nm to 50 nm (e.g. range from 1 nm to 20 nm). When the thickness of the adhesive layer 422 is below 1 nm, it may be difficult to evenly form the adhesive layer 422 over the semiconductor layer 30, and improving adhesion by the adhesive layer 422 may be insufficient. However, the present inventive concept is not limited thereto, and for example, the thickness of the adhesive layer 422 may change in consideration of materials, process conditions, etc.

The electrode layer 424 may be disposed over the adhesive layer 422. The electrode layer 424 may come into contact with the adhesive layer 422 so as to simplify the structure of the first electrode 42. However, the present inventive concept is not limited thereto.

The electrode layer 424 disposed over the adhesive layer 422 may be configured as a single layer, or may include a plurality of layers in order to improve various properties. In the present embodiment, the electrode layer 424 may be configured as a single layer, which is interposed between and comes into contact with the adhesive layer 422 and the barrier layer 428. The electrode layer 424 serves to impart the first electrode 42 with a reduced resistance and increased electrical conductivity, and also serves as a conductive layer that substantially transfers current. In addition, the electrode layer 424 serves as a barrier for preventing the constituent material of the pad layer 426 from diffusing into the semiconductor layer 30 or the semiconductor substrate. That is, the electrode layer 424 may serve as a conductive layer and a barrier layer. The electrode layer 424 described above may be formed of a metal having conductivity, and for example, may include copper, aluminum, silver, gold, or alloys thereof as a main component. For example, the electrode layer 424 may include copper, aluminum, silver, gold, or alloys thereof in an amount from 90 weight parts to 100 weight parts. In particular, the electrode layer 424 may include aluminum as a main component. In this case, the electrode layer 424 may be manufactured at low costs and may have excellent conductivity.

Meanwhile, The electrode layer 424 may have a greater thickness than the adhesive layer 422 and the barrier layer 428, which ranges from 50 nm to 400 nm. In one example, the thickness of the electrode layer 424 may range from 100 nm to 400 nm (more specifically, range from 100 nm to 300 nm). When the thickness of the electrode layer 424 is below 50 nm, the electrode layer 424 may have difficulty in functioning as a barrier layer and a conductive electrode layer. When the thickness of the electrode layer 424 exceeds 400 nm, the manufacturing costs may increase even if the conductivity of the electrode layer 424 is not greatly improved. When the thickness of the electrode layer 424 is 100 nm or more, the resistance of the first electrode 42 may be further reduced. When the thickness of the electrode layer 424 is 300 nm or less, a peel-off phenomenon attributable to increased thermal stress may be effectively prevented without an excessive reduction in resistance. However, the present inventive concept is not limited thereto, and the thickness of the electrode layer 424 may change.

The barrier layer 428, which is formed over the electrode layer 424 so as to be located between the electrode layer 424 and the pad layer 426, may prevent a reaction between the electrode layer 424 and the pad layer 426, or may prevent the material of the electrode layer 424 from diffusing into the pad layer 426. At this time, both surfaces of the barrier layer 428 may come into contact with the electrode layer 424 and the pad layer 426 respectively so as to simplify the structure of the first electrode 42.

Because the reaction between the electrode layer 424 and the pad layer 426 or the diffusion of the constituent material of the electrode layer 424 may occur at a high temperature (e.g. upon annealing of the electrodes 42 and 44), the barrier layer 428 may include a metal, which has a higher melting point than the electrode layer 424, as a main component. That is, the barrier layer 428 includes a metal, which is different from that of the electrode layer 424 and has a relatively high melting point, as a main component. In one example, the barrier layer 428 may include a refractory metal as a main component. As such, because the refractory metal has a high melting point, and thus requires a relatively large amount of energy for the diffusion of a constituent material thereof, for example, diffusion may not easily occur even when annealing is performed at a thermal treatment temperature higher than room temperature. Accordingly, the barrier layer 428 may prevent the diffusion of materials of the electrode layer 424 and the pad layer 426, and consequently, prevent for example, chemical reactions therebetween. When the barrier layer 428 includes no refractory metal, the barrier layer 428 may have difficulty in exerting sufficient effects. Here, the refractory metal means a material that has a higher melting point than the melting point (about 1538° C.) of iron.

In addition, the coefficient of thermal expansion of the barrier layer 428 may be less than the coefficient of thermal expansion of the electrode layer 424, and may be less than the coefficient of thermal expansion of the pad layer 426. When the first electrode 42 includes a material having a high coefficient of thermal expansion at a large thickness, the first electrode 42 may be more vulnerable to thermal stress. In consideration of this, in the present embodiment, the barrier layer 428 having a low coefficient of thermal expansion may be interposed between the electrode layer 424 and the pad layer 426, which have relatively high coefficients of thermal expansion, so as to function as a thermal buffer layer. Thereby, the first electrode 42 may be capable of resisting thermal stress.

For example, the coefficient of thermal expansion of a constituent material (e.g. a metal) of the barrier layer 428 may range from about 4.5 ppm/K to about 14 ppm/K (e.g. range from 4.5 ppm/K to 10 ppm/K). When the coefficient of thermal expansion is below 4.5 ppm/K or exceeds 14 ppm/K, the barrier layer 428 may not sufficiently serve as a thermal buffer layer. At this time, when the coefficient of thermal expansion ranges from 4.5 ppm/K to 10 ppm/K, the barrier layer 428 may exhibit further improved effects as a thermal buffer layer.

In one example, the barrier layer 428 may include titanium, molybdenum, chrome or tungsten, which may satisfy all of the above-described conditions, as a main component. For example, the barrier layer 428 may include titanium, molybdenum, chrome or tungsten in an amount from 90 weight parts to 100 weight parts. For example, the barrier layer 428 may include titanium, molybdenum, chrome or tungsten in the state of a single metal, rather than an alloy, so as to effectively realize desired properties. However, the present inventive concept is not limited thereto, and the barrier layer 428 may be formed of an alloy including at least one of titanium, molybdenum, chrome, and tungsten.

At this time, tungsten is expensive and may greatly increase manufacturing costs, and chrome may become a target of various regulations due to, for example, hexavalent chrome, which may have a bad effect on the environment. Therefore, the barrier layer 428 may be formed of titanium, molybdenum, or chrome, and more specifically, may be formed of titanium or molybdenum. In particular, molybdenum has a lower specific resistance than titanium, and thus may greatly reduce the resistance of the first electrode 42.

The concrete coefficient of thermal expansion of titanium, molybdenum, chrome or tungsten has already been described, and thus a detailed description thereof will be omitted below. On the other hand, with regard to a constituent material of the pad layer 46, the coefficient of thermal expansion of a nickel-vanadium alloy may be about 13 ppm/K, and the coefficient of thermal expansion of tin may range from 17 ppm/K to 36 ppm/K, which is greater than in the barrier layer 428. However, the present inventive concept is not limited thereto, and the coefficient of thermal expansion of the pad layer 426 may be equal to or less than that of the barrier layer 428.

In the present embodiment, the barrier layer 428 may be thicker than the adhesive layer 422, and thinner than the electrode layer 424. The barrier layer 428 is located farther away from the semiconductor substrate 10 than the electrode layer 424, and thus does not need to be light-transmissive. Therefore, the barrier layer 428 does not require high light-transmittance, and therefore may be thicker than the adhesive layer 422 and thus may have lower light-transmittance than the adhesive layer 422. In addition, the barrier layer 428, which is thicker than the adhesive layer 422, may exhibit improved barrier effects. In addition, because the electrode layer 424 substantially functions as the first electrode 42, reducing the thickness of the barrier layer 428 compared to the electrode layer 424 may prevent the thickness of the first electrode 42 from being unnecessary increased.

For example, the ratio of the thickness of the adhesive layer 422 to the thickness of the barrier layer 428 may range from 1:2 to 1:30. When the ratio is below 1:2, the barrier layer 428 may not exert sufficient effects due to an insufficient thickness thereof, or the adhesive layer 422 may have low reflectance of a long wavelength region of light attributable to a large thickness thereof. When the ratio exceeds 1:30, the barrier layer 428 having a large thickness may cause increased manufacturing costs and time, and the adhesive layer 422 may not exert sufficient effects due to a small thickness thereof. In one example, the ratio may range from 1:4 to 1:25.

Alternatively, the thickness of the barrier layer 428 may be 80 nm or less. When the thickness exceeds 80 nm, the barrier layer 428 may cause increased manufacturing costs and time due to the large thickness. In one example, the thickness of the barrier layer 428 may range from 2 nm to 80 nm. When the thickness of the barrier layer 428 is below 2 nm, the barrier layer 428 may not exert sufficient effects due to an insufficient thickness thereof. However, the present inventive concept is not limited thereto. When the barrier layer 428 includes a material having a low specific resistance, the thickness of the barrier layer 428 may be increased in order to reduce the resistance of the first electrode 42. Various other alterations are possible.

In addition, the specific resistance of the barrier layer 428 may be greater than that of the electrode layer 424. For example, with regard to a constituent material of the barrier layer 428, the specific resistance of titanium may be about 42 mΩ·cm, the specific resistance of molybdenum may be about 5.34 mΩ·cm, the specific resistance of chrome may be about 13 mΩ·cm, and the specific resistance of tungsten may be about 5.60 mΩ·cm. In addition, with regard to a constituent material of the electrode layer 424, the specific resistance of copper may be about 1.68 mΩ·cm, the specific resistance of aluminum may be about 2.65 mΩ·cm, the specific resistance of silver may be about 1.59 mΩ·cm, and the specific resistance of gold may be about 2.44 mΩ·cm.

In one example, the specific resistance of the barrier layer 428 may be less than that of the pad layer 426. With regard to a constituent material of the pad layer 426, the specific resistance of a nickel-vanadium alloy may be about 63 mΩ·cm, and the specific resistance of tin may be about 11 mΩ·cm. That is, when the pad layer 426 includes the nickel-vanadium alloy, the barrier layer 428 has a lower specific resistance than the pad layer 426 even though it includes any one of titanium, molybdenum, chrome and tungsten. In addition, when the pad layer 426 includes tin, the barrier layer 428 has a lower specific resistance than the pad layer 426 when it includes molybdenum or tungsten. However, the present inventive concept is not limited thereto, and the specific resistance of the barrier layer 428 may be equal to or greater than the specific resistance of the pad layer 426.

However, the present inventive concept is not limited as to, for example, the thickness of the adhesive layer 422, the thickness of the barrier layer 428, the light-transmittance of the barrier layer 428, and the specific resistance of the barrier layer 428.

As described above, in the present embodiment, the adhesive layer 422 and the barrier layer 428, which are disposed on opposite surfaces of the electrode layer 424, may include a refractory metal, which is selected from among titanium, molybdenum, chrome and tungsten, as a main component. That is, when the refractory metal having a high melting point is disposed on opposite surfaces of the electrode layer 424 and is subjected to, for example, annealing at a high temperature, it is possible to effectively prevent the constituent material of the electrode layer 424 (more particularly, a main component material) from diffusing into the semiconductor substrate 10 or the semiconductor layer 30 and the pad layer 426.

In one example, the adhesive layer 422 and the barrier layer 428, which are disposed on opposite surfaces of the electrode layer 424, may have the same main component material. As such, the kind of metal, which is available in the manufacturing process, may be limited, which may simplify the manufacturing process and reduce manufacturing costs. In addition, the adhesive layer 422 and the barrier layer 428 may have the same or similar low coefficient of thermal expansion, thus effectively withstanding thermal stress.

Alternatively, the specific resistance of the barrier layer 428 may be equal to or less than the specific resistance of the adhesive layer 422. The barrier layer 428 and the adhesive layer 422 may have the same main component material so as to have the same specific resistance, or the main component material of the barrier layer 428 may have a lower specific resistance than the adhesive layer 422 so that the specific resistance of the barrier layer 428 is less than the specific resistance of the adhesive layer 422. As such, the barrier layer 428, which is thicker than the adhesive layer 422, may have a specific resistance equal to or less than that of the adhesive layer 422, which may further reduce the resistance of the first electrode 42. For example, each of the adhesive layer 422 and the barrier layer 428 includes titanium or molybdenum as a main component, or the adhesive layer 422 may include titanium as a main component, and the barrier layer 428 may include molybdenum, which has lower resistance than titanium, as a main component.

Figure 5:
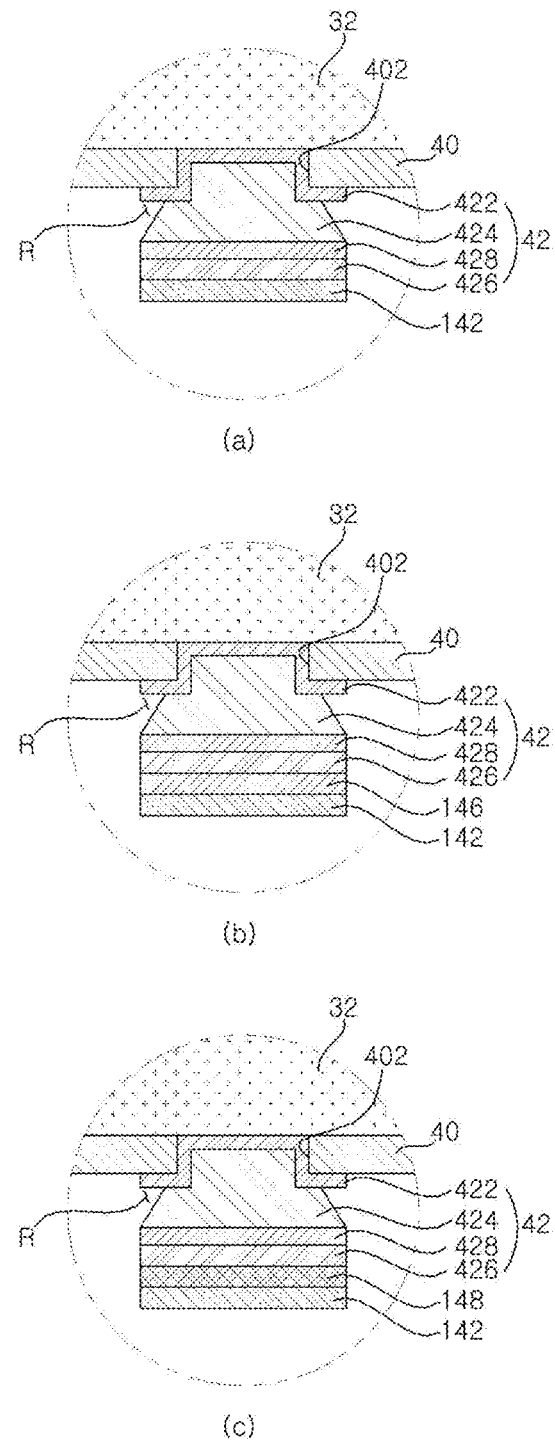
FIG. 5 is an enlarged view illustrating various examples of the attachment structure of a first electrode and a ribbon in a solar cell according to an embodiment of the present inventive concept.

The pad layer 426 may be disposed over the barrier layer 428. In one example, the pad layer 426 may be formed over the barrier layer 428 so as to come into contact with the barrier layer 428. The pad layer 426 is a portion that is connected to the ribbon 142, and may include a material capable of realizing an excellent connection with the ribbon 142. Various examples of the connection structure of the pad layer 426 and the ribbon 142 will be described below with reference to FIG. 5. FIG. 5 is an enlarged view illustrating various examples of the attachment structure of the first electrode 42 and the ribbon 142 in the solar cell 150 according to an embodiment of the present inventive concept. For clear and brief description, in FIG. 5, the shape of the first electrode 42 is illustrated based on the shape illustrated in the enlarged circle of FIG. 2.

In one example, as illustrated in FIG. 5(*a*), the ribbon 142, which includes, for example, lead (Pb) and tin, may be disposed over the pad layer 426, and then be directly attached to the pad layer 426 upon receiving heat. Alternatively, as illustrated in FIG. 5(*b*), in a state in which paste (e.g. solder paste including, for example, tin and bismuth) is located between the pad layer 426 and the ribbon 142, the pad layer 426 and the ribbon 142 may be attached to each other via a paste layer 146 via application of heat. Alternatively, as illustrated in FIG. 5(*c*), in a state in which a conductive film 148 is interposed between the pad layer 426 and the ribbon 142, the pad layer 426 and the ribbon 142 may be attached to each other via the conductive film 148 via application of pressure. The conductive film 148 may be formed by dispersing conductive particles, which are formed of, for example, highly conductive gold, silver, nickel or copper, in a film formed of, for example, epoxy resin, acryl resin, polyimide resin, or polycarbonate resin. When heat and pressure are applied to the conductive film, the conductive particles are exposed out of the film, and the solar cell 150 and the ribbon 142 may be electrically connected to each other via the exposed conductive particles. In the case where multiple solar cells 150 are connected to one another by the conductive film (not illustrated) so as to constitute a module, a process temperature may be reduced, which may prevent bending of the solar cell 150. The pad layer 426 and the ribbon 142 may be attached and connected to each other via various other methods.

The pad layer 426 may include tin (Sn) or nickel-vanadium alloy (NiV). The tin advantageously has excellent adhesion with the ribbon 142 or the paste for connection with the ribbon 142. In addition, the nickel-vanadium alloy has excellent adhesion with the ribbon 142 or the paste for connection with the ribbon 142. More specifically, in the case of paste including tin and bismuth, the tin in the paste and the nickel in the nickel-vanadium alloy exhibit very excellent adhesion. In addition, the nickel-vanadium alloy has a very high melting point of about 1000° C. or more, which is higher than the constituent material of the electrode layer 424. Thereby, the pad layer 426 is not deformed during bonding with the ribbon 142 or during the manufacture of the solar cell 150, and may sufficiently serve as a capping film for protecting the electrode layer 424.

The pad layer 426 may have a nano-unit thickness, for example, a thickness within a range from 50 nm to 300 nm. The pad layer 426 may have deteriorated adhesion with the ribbon 142 when the thickness thereof is below 50 nm, and may cause increased manufacturing costs when the thickness thereof exceeds 300 nm. However, the present inventive concept is not limited thereto, and for example, the thickness of the pad layer 426 may change in various ways.

In the present embodiment, the first electrode 42, which includes the adhesive layer 422, the electrode layer 424, the barrier layer 428, and the pad layer 426, may be formed by, for example, sputtering. That is, after metal layers, which respectively form the adhesive layer 422, the electrode layer 424, the barrier layer 428, and the pad layer 426, are formed so that the opening 402 (or the opening 404 in the case of the second electrode 44) of the passivation film 40, formed over the back surface of the semiconductor substrate 10, is filled with the metal layers, the metal layers are patterned so as to form the adhesive layer 422, the electrode layer 424, the barrier layer 428, and the pad layer 426 of the first electrode 42 (and/or the second electrode 44). Various patterning methods may be applied. In one example, patterning may be performed by a method using a resist and etching solution.

At this time, the first electrode 42 and the second electrode 44 may be formed by simultaneously patterning the same metal layers.

Because the corresponding materials are stacked one above another in the thickness direction of the solar cell 150 when using sputtering as described above, the respective layers of the first electrode 42 are stacked one above another such that the entire adhesive layer 422 has a uniform thickness, the entire electrode layer 424 has a uniform thickness, the entire barrier layer 428 has a uniform thickness, and the entire pad layer 426 has a uniform thickness. Here, the uniform thickness may mean a thickness that may be determined as being uniform in consideration of, for example, a given process error (e.g. a thickness having a difference within 10%).

Referring again to FIG. 2, the first electrode 42 may have a greater width W2 than the width W1 of the opening 402. This serves to reduce the resistance of the first electrode 42 by providing the first electrode 42 with the sufficient width W2 (the greatest width among the widths of respective constituent portions of the first electrode 42). For example, the width W1 of the opening 402 may range from 10 μm to 50 μm, and the width W2 of the first electrode 42 may range from 200 μm to 250 μm. When the width W1 of the opening 402 is below 10 μm, the first electrode 42 and the first conductive area 32 may be not smoothly connected to each other. When the width W1 of the opening 402 exceeds 50 μm, there is high possibility of damage to the first conductive area 32 when the opening 402 is formed. When the width W2 of the first electrode 42 is below 200 μm, the first electrode 42 may not have sufficient resistance. When the width W2 of the first electrode 42 exceeds 250 μm, the first electrode 42 may unnecessarily cause, for example, short-circuit with the second electrode 44 adjacent thereto. However, the present inventive concept is not limited thereto, and the width W1 of the opening 402 and the width W2 of the first electrode 42 may have various other values.

Accordingly, the first electrode 42 (more particularly, the adhesive layer 422) may be formed over the bottom surface of the opening 402 (i.e. the surface in contact with the semiconductor layer 30 or the conductive areas 32 and 34), the side surface of the passivation film 40 adjacent to the opening 402, and a portion of the passivation film 40 adjacent to the opening 402. In particular, the adhesive layer 422 may be disposed so as to come into contact with the bottom surface of the opening 402 (i.e. the surface in contact with the semiconductor layer 30), the side surface of the passivation film 40 adjacent to the opening 402, and a portion of the passivation film 40 adjacent to the opening 402. Based on the fact that the first electrode 42 is formed over the side surface of the passivation film 40 adjacent to the opening 402 and over the passivation film 40 adjacent to the opening 402, it can be appreciated that the electrodes 42 and 44 are formed by forming the metal layers, which constitute the electrodes 42 and 44, over the entire passivation film 40, and then patterning the metal layers.

In addition, in one example, a recess (or undercut) R may be located in at least a portion of the side surface of the first electrode 42 (more particularly, the side surface of a portion disposed over the passivation film 40). The recess R may be formed for various reasons. In one example, the recess R having the shape illustrated in FIG. 2 is formed because, when the first and second electrodes 42 and 44 are patterned via, for example, spraying, a portion close to the place at which the spraying is performed (i.e. a portion located toward the adhesive layer 422) is etched more, and a portion distant from the place at which the spraying is performed (i.e. a portion located toward the pad layer 426) is etched less.

More accurately, in the present embodiment, the recess R may be located in the side surface of the electrode layer 424 of the first electrode 42. This is because the recess R is not formed or the recess R having a small width is formed in the adhesive layer 422, the barrier layer 428 and the pad layer 426, which have excellent acid-resistance, whereas the recess R may be easily formed by the etching solution in the electrode layer 424, which has relatively low acid-resistance. Accordingly, at least a portion of the electrode layer 424 may have a width W21 (i.e. the smallest width among the widths of constituent portions of the first electrode 42), which is smaller than the width W2 of the first electrode 42 (e.g. the width of the adhesive layer 422 or the pad layer 426). The drawing illustrates one example in which a portion of the electrode layer 424, which is located adjacent to the barrier layer 428, has a thickness the same as the width of the barrier layer 428, but the remaining portion of the electrode layer 424 is gradually reduced with approaching the adhesive layer 422.

However, the present inventive concept is not limited thereto. For example, as illustrated in FIG. 3, the width of the recess R formed in the electrode layer 424 may be gradually increased with decreasing distance to the adhesive layer 422 and the barrier layer 428, and may be gradually reduced with increasing distance from the adhesive layer 422 and the barrier layer 428. Accordingly, the recess R may be shaped such that the width thereof is gradually reduced and then increased with increasing distance from the adhesive layer 422 and decreasing distance to the barrier layer 428. In addition, the recess R may provide the side surface of the electrode layer 424 with a rounded shape. The recess R having the shape described above may be formed upon wet etching using, for example, dipping. This is because a portion of the electrode layer 424, which is adjacent to the adhesive layer 422, the barrier layer 428 and the pad layer 426 in which etching does not progress well, is etched less, and an inner portion of the electrode layer 424, which is not adjacent to the aforementioned layers, may be etched easily. The shape of the electrode layer 424, which is attributable to the recess R, may be altered in various ways.

Referring again to FIG. 2, in one example, the width W22 of the recess R (or the difference between the width W2 of the adhesive layer 422 or the pad layer 426 and the smallest width W21 of the electrode layer 424 at one side of the first electrode 42) may range from 1 μm to 10 μm. This is limited to the range that may result from wet etching. However, the present inventive concept is not limited thereto, and the width W22 of the recess R may have various values.

It can be appreciated from the presence of the recess R that the electrodes 42 and 44 are formed by forming metal layers, which constitute the electrodes 42 and 44, over the entire passivation film 40, and patterning the metal layers via etching.

As described above, in the present embodiment, the first electrode 42 may be formed without plating. When a portion of the first electrode 42 is formed via plating, undesired portions may be plated when defects, such as pin holes and scratches, which may be present in the passivation film 40, are plated. In addition, because the plating solution is acid or alkali, it may damage the passivation film 40 or may deteriorate the properties of the passivation film 40. In the present embodiment, through the omission of plating, the properties of the passivation film 40 may be improved and the first electrode 42 may be formed via a simplified process.

However, the present inventive concept is not limited thereto, and the adhesive layer 422, the electrode layer 424 and the pad layer 426 may be formed by various methods and may be patterned by various methods.

In addition, because the barrier layer 428 is provided between the electrode layer 424 and the pad layer 426, it is possible to prevent problems caused by any reaction between the electrode layer 424 and the pad layer 426.

Hereinafter, the plan shape of the first conductive area 32, the second conductive area 34, the barrier area 36, and the first and second electrodes 42 and 44 will be described in detail with reference to FIG. 4.

Figure 4:
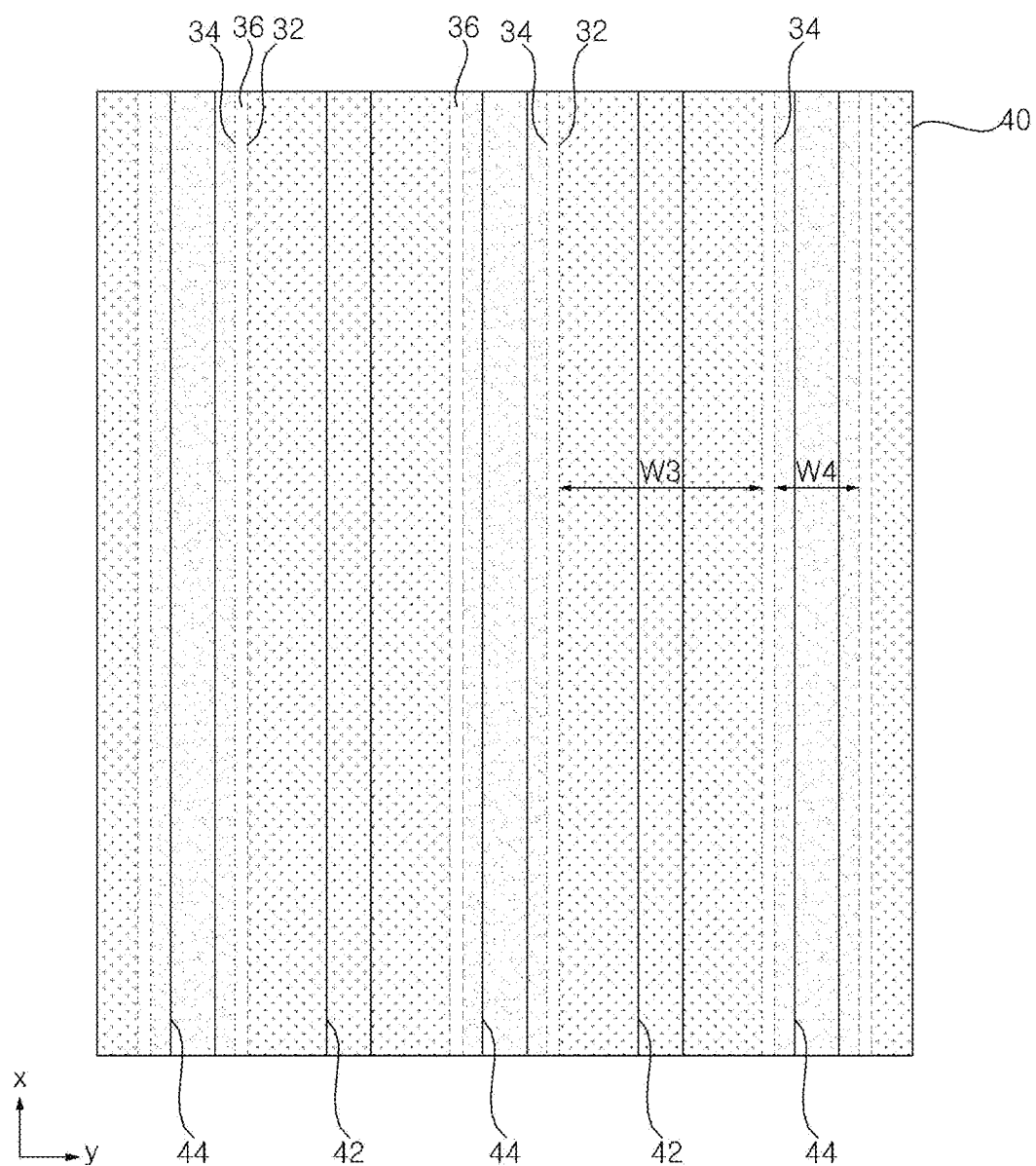
FIG. 4 is a partial rear plan view of the solar cell illustrated in FIG. 2.

Referring to FIGS. 2 and 4, in the present embodiment, the first conductive area 32 and the second conductive area 34 extend a long length to have a strip shape respectively, and are alternately arranged in the direction crossing the longitudinal direction thereof. The barrier area 36 may be located between the first conductive area 32 and the second conductive area 34 so that the first and second conductive areas 32 and 34 are spaced apart from each other by the barrier area 36. Although not illustrated in the drawings, a plurality of first conductive areas 32, which is spaced apart from one another, may be connected to one another at one edge, and a plurality of second conductive areas 34, which is spaced apart from one another, may be connected to one another at the other edge. However, the present inventive concept is not limited thereto.

At this time, the area of the first conductive area 32 may be greater than the area of the second conductive area 34. In one example, the areas of the first conductive area 32 and the second conductive area 34 may be adjusted by providing the first conductive area 32 and the second conductive area 34 with different widths. That is, the width W3 of the first conductive area 32 may be greater than the width W4 of the second conductive area 34.

In addition, the first electrode 42 may have a strip shape so as to correspond to the first conductive area 32, and the second electrode 44 may have a strip shape so as to correspond to the second conductive area 34. The respective openings (see reference numerals 402 and 404 in FIG. 1) may be formed along the entire length of the first and second electrodes 42 and 44 so as to correspond to the first and second electrodes 42 and 44. Thereby, the contact area between the first and second electrodes 42 and 44 and the first and second conductive areas 32 and 34 may be maximized, which may improve carrier collection efficiency. However, the present inventive concept is not limited thereto. Of course, the openings 402 and 404 may be formed so as to connect only a portion of the first and second electrodes 42 and 44 to the first conductive area 32 and the second conductive area 34 respectively. For example, the openings 402 and 404 may take the form of a plurality of contact holes. In addition, although not illustrated in the drawings, a plurality of first electrodes 42 may be connected to one another at one edge, and a plurality of second electrodes 44 may be connected to one another at the other edge. However, the present inventive concept is not limited thereto.

In addition, the shape of the first and second conductive areas 32 and 34 and the arrangement or shape of the first and second openings 402 and 404 are not limited to the above description. For example, the second conductive area 34 may include a plurality of islands spaced apart from one another, and the first conductive area 32 may be formed by integrating the remaining portion excluding the second conductive area 34. The first and second openings 402 and 404 may have a shape and arrangement for connection with the first and second conductive areas 32 and 34 respectively. Various other alterations are possible.

Referring again to FIG. 2, the front-surface passivation film 24 and/or the anti-reflection film 26 may be disposed over the front surface of the semiconductor substrate 10 (more accurately, over the front-surface field area 130 formed on the front surface of the semiconductor substrate 10). In some embodiments, only the front-surface passivation film 24 may be formed on the semiconductor substrate 10, only the anti-reflection film 26 may be formed on the semiconductor substrate 10, or the front surface passivation film 24 and the anti-reflection film 26 may be disposed on the semiconductor substrate 10 in sequence. FIG. 2 illustrates that the front-surface passivation film 24 and the anti-reflection film 26 are formed on the semiconductor substrate 10 in sequence such that the semiconductor substrate 10 comes into contact with the front-surface passivation film 24. However, the present inventive concept is not limited thereto, and the semiconductor substrate 10 may come into contact with the anti-reflection film 26, and various other alterations are possible.

The front-surface passivation film 24 and the anti-reflection film 26 may be formed substantially over the entire surface of the semiconductor substrate 10. Here, the expression "the film formed over the entire substrate" includes not only the case where the film is physically completely formed over the entire substrate, but also the case where the film is inevitably formed on all excluding a portion of the substrate.

The front-surface passivation film 24 comes into contact with the front surface of the semiconductor substrate 10 for passivation of defects present in the front surface or the bulk of the semiconductor substrate 10. As such, it is possible to increase the open-circuit voltage of the solar cell 150 by removing recombination sites of minority carriers. The anti-reflection film 26 reduces the reflectance of light introduced into the front surface of the semiconductor substrate 10. This may increase the quantity of light, which reaches the pn junction formed at the interface of the base area 110 and the first conductive area 32. Thereby, the short-circuit current Isc of the solar cell 150 may be increased. In conclusion, the front-surface passivation film 24 and the anti-reflection film 26 may increase the open-circuit voltage and the short-circuit current of the solar cell 150, thereby improving the efficiency of the solar cell 150.

The front-surface passivation film 24 and/or the anti-reflection film 26 may be formed of various materials. In one example, the front-surface passivation film 24 and/or the anti-reflection film 26 may include a single film or multiple films in the form of a combination of two or more films selected from the group consisting of a silicon nitride film, silicon nitride film containing hydrogen, silicon oxide film, silicon oxide nitride film, silicon carbide film, $Al_2O_3$, $MgF_2$, ZnS, $TiO_2$, and $CeO_2$. In one example, the front-surface passivation film 24 be a silicon oxide film formed over the semiconductor substrate 10, and the anti-reflection film 26 may take the form of a stack in which a silicon nitride film and a silicon carbide film are stacked one above another in sequence.

When light is introduced into the solar cell 150 according to the present embodiment, holes and electrons are generated via photoelectric conversion at the pn junction formed between the base area 110 and the first conductive area 32. The generated holes and electrons move to the first conductive area 32 and the second conductive area 34 by passing through the tunneling layer 20, and thereafter move to the first and second electrodes 42 and 44. This results in the generation of electricity.

In the back contact type solar cell 150 according to the present embodiment in which the electrodes 42 and 44 are formed on the back surface of the semiconductor substrate 10 and no electrodes are formed on the front surface of the semiconductor substrate 10, it is possible to minimize shading loss on the front surface of the semiconductor substrate 10. This may improve the efficiency of the solar cell 150. However, the present inventive concept is not limited thereto.

In addition, because the first and second conductive areas 32 and 34 are formed over the semiconductor substrate 10 with the tunneling layer 20 interposed therebetween, the first and second conductive areas 32 and 33 may form a layer separate from the semiconductor substrate 10. Thereby, loss caused by recombination may be minimized as compared to the case where a doped area, formed by doping the semiconductor substrate 10 with a dopant, is used as a conductive area.

In addition, in the present embodiment, the barrier layer 248 may be provided between the electrode layer 424 and the pad layer 426 so as to prevent problems caused by any reaction between the electrode layer 424 and the pad layer 426. This will be described below in detail with reference to FIGS. 6 to 8.

Figure 6:
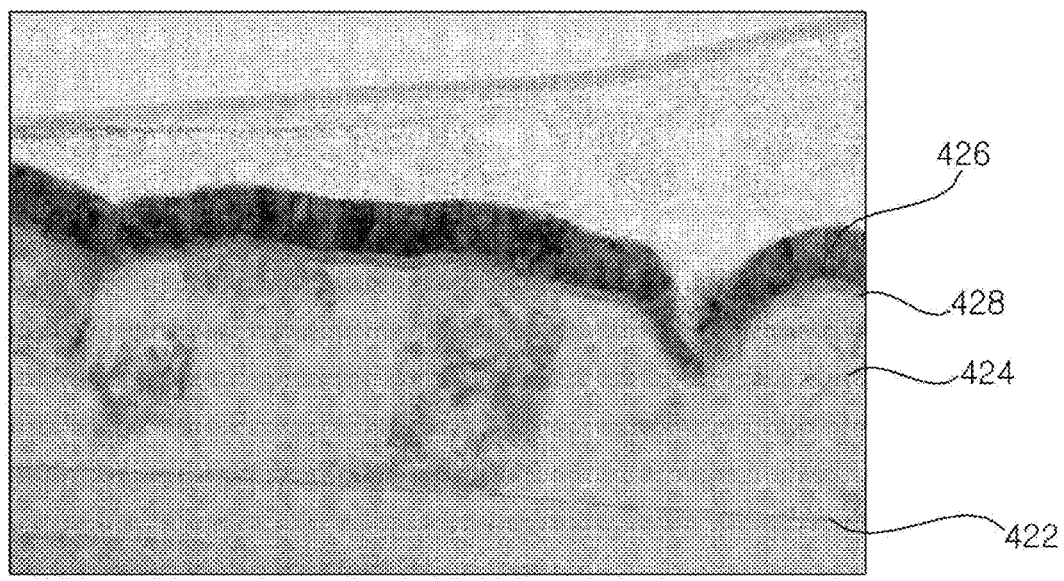
FIG. 6 is a photograph illustrating the cross section of a first electrode in a solar cell according to an example of the present inventive concept.
Figure 7:
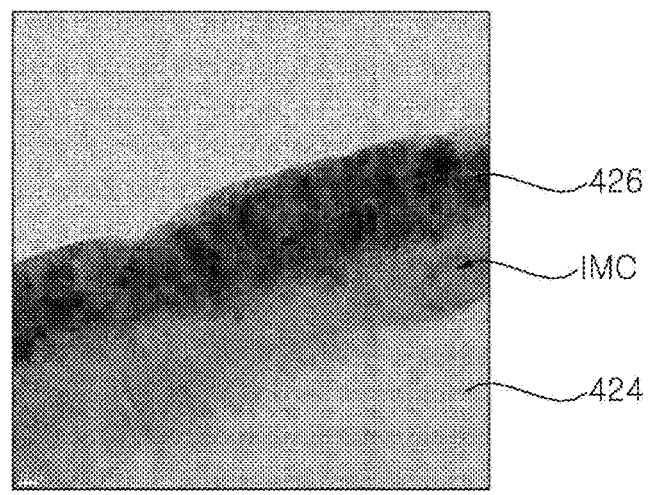
FIG. 7 is a photograph illustrating the cross section of an electrode in a solar cell according to a comparative example.
Figure 8:
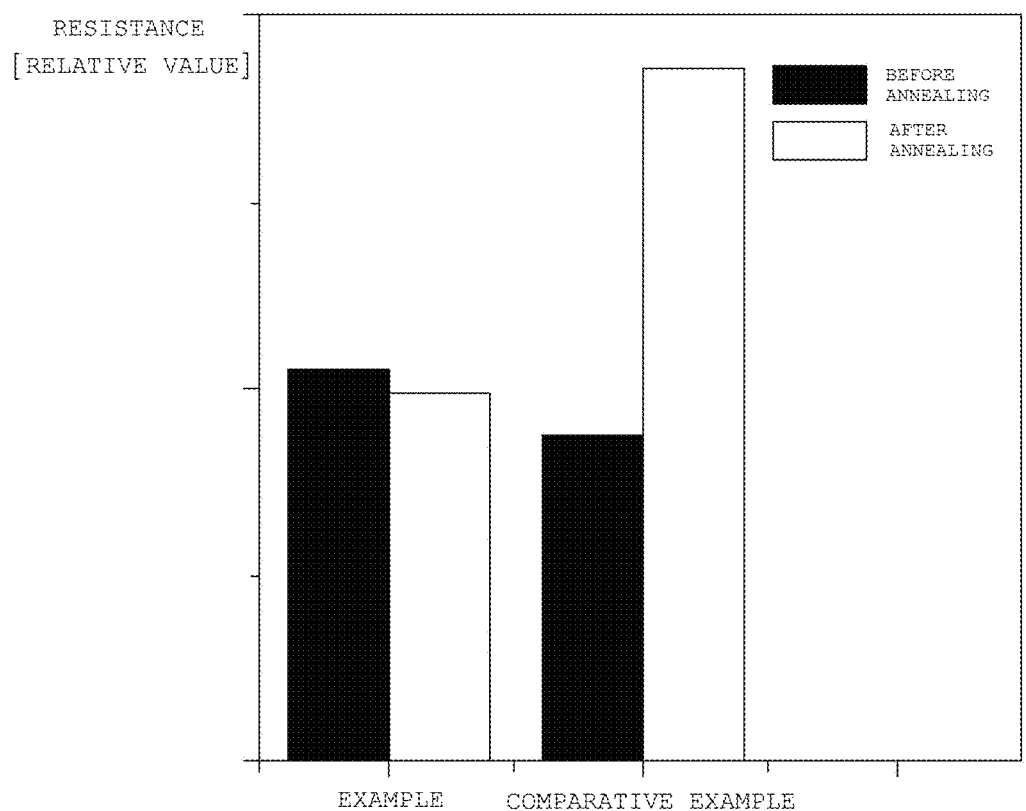
FIG. 8 is a graph illustrating the results of measuring the resistance of the electrodes in the solar cells according to the example of the present inventive concept and the comparative example before and after annealing.

FIG. 6 is a photograph illustrating the cross section of the first electrode 42 in the solar cell 150 according to an example of the present inventive concept, FIG. 7 is a photograph illustrating the cross section of an electrode in a solar cell according to a comparative example, and FIG. 8 is a graph illustrating the results of measuring the resistance of the electrodes in the solar cells according to the example of the present inventive concept and the comparative example before and after annealing.

For example, in the case where the electrode layer 424 includes aluminum and the pad layer 426 includes a nickel-vanadium alloy, as illustrated in FIG. 6, it can be appreciated that no product (e.g. an intermetallic compound) is formed between the electrode layer 424 and the pad layer 426 when the barrier layer 428 is provided between the electrode layer 424 and the pad layer 426 as in the present example. On the other hand, in a comparative example in which no barrier layer is provided, as illustrated in FIG. 7, it can be appreciated that a thick intermetallic compound is formed between the electrode layer 424 and the pad layer 426 via a reaction between the aluminum in the electrode layer 424 and the nickel in the pad layer 426. When the intermetallic compound is formed, it may greatly increase the resistance of the first and second electrodes 42 and 44, thus causing deterioration in the electrical properties of the first and second electrodes 42 and 44. Although the case where the electrode layer 424 includes aluminum and the pad layer 426 includes nickel has been described by way of example, the present inventive concept is not limited thereto.

In addition, as illustrated in FIG. 8, it can be appreciated that the electrode of the solar cell according to the example has similar resistance before and after annealing, whereas the electrode of the solar cell according to the comparative example is greatly increased in resistance after annealing compared to before annealing. In the solar cell according to the comparative example, it is assumed that the difference in resistance before and after annealing is caused because the intermetallic compound is formed via a reaction between the material of the electrode layer and the material of the pad layer.

In addition, the pad layer 426 and the ribbon 142 in the present example may have excellent adhesion, whereas the pad layer 426 and the ribbon 142 in the comparative example may not have excellent adhesion. That is, in the present example, the barrier layer 428 may prevent the constituent material of the electrode layer 424 from diffusing into the inside or the surface of the pad layer 426, thereby providing the pad layer 426 with inherent excellent adhesion with the ribbon 142. On the other hand, in the comparative example, the material of the electrode layer 424 may diffuse to the inside or the surface of the pad layer 426, thereby causing deterioration in the properties of the pad layer 426. For example, because a soldering material (e.g. solder paste) used upon the attachment of the ribbon 142 mainly has a hydrophobic property, when, for example, the aluminum in the electrode layer 424 diffuses into the pad layer 426 as in the comparative example, a hydrophilic aluminum oxide may be formed, causing deterioration in the wettability of the soldering material of the ribbon 142 in the pad layer 426. Thereby, the adhesion between the pad layer 426 and the ribbon 142 may be greatly deteriorated.

As described above, in the present example, the barrier layer 428 may prevent problems caused by a reaction between the electrode layer 424 and the pad layer 426, thereby providing the first and second electrodes 42 and 44 with low resistance and excellent attachment to the ribbon 142. Thereby, the efficiency of the solar cell 150 may be improved and the output of the solar cell panel 100 may be increased. In addition, various properties of the first and second electrodes 42 and 44 may be further improved by the adhesive layer 422.

Hereinafter, solar cells according to other embodiments of the present inventive concept will be described in detail. A detailed description of parts, which are the same as or extremely similar to the above description, will be omitted and only different parts will be described in detail.

Figure 9:
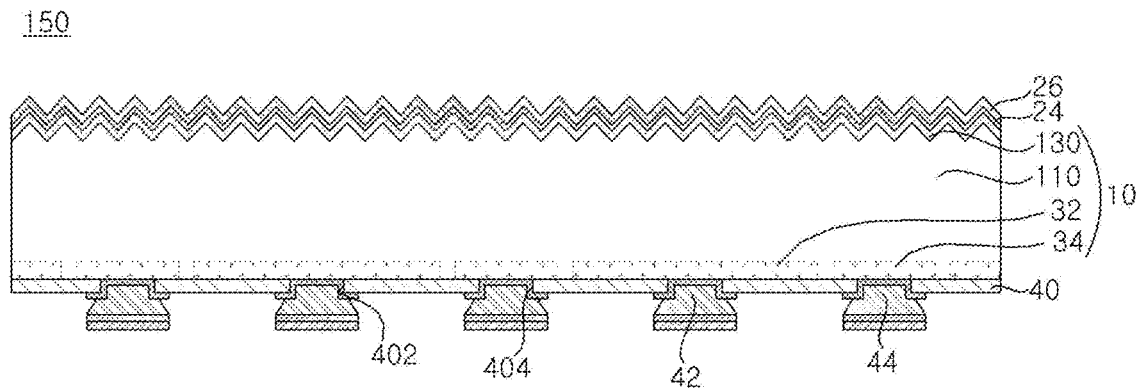
FIG. 9 is a sectional view illustrating a solar cell according to a further embodiment of the present inventive concept.

FIG. 9 is a sectional view illustrating a solar cell according to a further embodiment of the present inventive concept.

Referring to FIG. 9, the solar cell 150 according to the present embodiment includes no tunneling layer (see reference numeral 20 in FIG. 2), and the first and second conductive areas 32 and 34 are configured as doped areas inside the semiconductor substrate 10. That is, each of the first and second conductive areas 32 and 34 is configured as a doped area, which is formed by doping the semiconductor substrate 10 with a first or second conductive dopant at a relatively high doping concentration. As such, the first and second conductive areas 32 and 34 include first or second conductive crystalline (monocrystalline or polycrystalline) semiconductors to constitute the semiconductor substrate 10. In one example, each of the first and second conductive areas 32 and 34 may be configured as a portion of a monocrystalline semiconductor substrate (e.g. a monocrystalline silicon wafer substrate) of a first or second conductive type.

In this embodiment, the adhesive layer (see reference numeral 422 in FIG. 2) of the first electrode 42 is formed in contact with the semiconductor substrate 10 (or the first conductive area 32 constituting a portion of the semiconductor substrate 10), and the adhesive layer 422 of the second electrode 44 is formed in contact with the semiconductor substrate 10 (or the second conductive area 34 constituting a portion of the semiconductor substrate 10). In the above description, there is only a difference in that the adhesive layer 422 of the first and second electrodes 42 and 44 comes into contact with the semiconductor substrate 10, other than the semiconductor layer 30, and thus, a detailed description thereof will be omitted.

As is apparent from the above description, a solar cell according to the present inventive concept may prevent any problem caused by a reaction between an electrode layer and a pad layer owing to a barrier layer, thereby imparting an electrode with low resistance and excellent adhesion with a ribbon. Thereby, it is possible to improve the efficiency of the solar cell and to increase the output of a solar cell panel. In addition, various properties of the electrode may further be improved via an adhesive layer.

The above described features, configurations, effects, and the like are included in at least one of the embodiments of the present inventive concept, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the inventive concept as disclosed in the accompanying claims.

What is claimed is:

1. A solar cell comprising:
   a semiconductor substrate;
   a conductive area disposed on one surface of the semiconductor substrate;
   a passivation blur having opening; and
   an electrode connected to the conductive area,
   wherein the electrode includes an adhesive layer directly disposed on the conductive area and including a first metal as a main component, an electrode layer directly disposed on the adhesive layer and including a second metal that is different from the first metal as a main component, a barrier layer directly disposed on the electrode layer and including a third metal that is different from the second metal as a main component, and a pad layer directly disposed on the barrier layer and including a fourth metal that is different from the third metal as a main component,
   wherein the electrode layer has a thickness greater than a thickness of each of the adhesive layer and the harrier layer,
   wherein the barrier layer has a thickness greater than a thickness of the adhesive layer, and
   wherein each of the adhesive layer, the electrode layer, the barrier layer, and the pad layer is formed of a sputtered layer.

2. The solar cell according to claim 1, wherein the barrier layer includes a refractory metal as the third metal.

3. The solar cell according to claim 1, wherein the barrier layer includes titanium (Ti), molybdenum (Mo), chrome (Cr), or tungsten (W) as the third metal.

4. The solar cell according to claim 1, wherein the barrier layer has a smaller coefficient of thermal expansion than a coefficient of thermal expansion of the electrode layer.

5. The solar cell according to claim 1, wherein the adhesive layer and the barrier layer have a thickness ratio within a range from 1:2 to 1:30.

6. The solar cell according to claim 1, wherein the barrier layer has a thickness of 80 nm or less.

7. The solar cell according to claim 1, wherein the barrier layer has a specific resistance equal to or less than a specific resistance of the adhesive layer.

8. The solar cell according to claim 7, wherein the specific resistance of the barrier layer is higher than a specific resistance of the electrode layer.

9. The solar cell according to claim 1, wherein the barrier layer has a light-transmittance lower than a light-transmittance of the adhesive layer.

10. The solar cell according to claim 1, wherein the adhesive layer includes a refractory metal as the first metal.

11. The solar cell according to claim 1, wherein the adhesive layer includes titanium (Ti), molybdenum (Mo), chrome (Cr) or tungsten (W) as the first metal.

12. The solar cell according to claim 1, wherein the adhesive layer has a coefficient of thermal expansion between a coefficient of thermal expansion of the semiconductor substrate or the conductive area and a coefficient of thermal expansion of a portion of the electrode layer that is adjacent to the adhesive layer.

13. The solar cell according to claim 1, wherein the adhesive layer has a thickness of 50 nm or less.

14. The solar cell according to claim 1, wherein the first metal of the adhesive layer and the third metal of the barrier layer, disposed on opposite surfaces of the electrode layer, are formed of the same material.

15. The solar cell according to claim 1, wherein the electrode layer includes at least one of copper (Cu), aluminum (Al), silver (Ag), gold (Au) and alloys thereof as the second metal.

16. The solar cell according to claim 1, wherein a ribbon is connected to the pad layer.

17. The solar cell according to claim 1, wherein the pad layer includes at least one of tin and a nickel-vanadium alloy (NiV) as the fourth metal.

18. The solar cell according to claim 1, wherein the conductive area includes first and second conductive areas disposed on the one surface of the semiconductor substrate,
   wherein the electrode includes a first electrode connected to the first conductive area and a second electrode connected to the second conductive area,
   wherein a width of the electrode layer is larger than a width of the opening, and
   wherein the barrier layer has a higher melting point than a melting point of the electrode layer.

19. The solar cell according to claim 1, wherein the adhesive layer is thinner than the passivation film.

* * * * *